US012803409B2

(12) United States Patent
Lin et al.

(10) Patent No.: US 12,803,409 B2
(45) Date of Patent: Nov. 17, 2026

(54) CONTROLLER OF POWER CONVERTER

(71) Applicant: uPI Semiconductor Corp., Hsinchu County (TW)

(72) Inventors: Yi-Ting Lin, Hsinchu County (TW); Yu-Te Liao, Hsinchu County (TW); Chung Lun Yang, Hsinchu County (TW); Wei-Chieh Hsueh, Hsinchu County (TW); Wei-Chuan Su, Hsinchu County (TW); Yen Hui Wang, Hsinchu County (TW)

(73) Assignee: uPI Semiconductor Corp., Hsinchu County (TW)

( * ) Notice: Subject to any disclaimer, the term of this patent is extended or adjusted under 35 U.S.C. 154(b) by 185 days.

(21) Appl. No.: 18/810,414

(22) Filed: Aug. 20, 2024

(65) Prior Publication Data

US 2025/0183780 A1 Jun. 5, 2025

(30) Foreign Application Priority Data

Nov. 30, 2023 (TW) ................................ 112146451

(51) Int. Cl.

*H02M 1/00* (2007.01)
*H02M 3/157* (2006.01)
*H03M 1/12* (2006.01)

(52) U.S. Cl.

CPC ......... *H02M 1/0012* (2021.05); *H03M 1/124* (2013.01); *H02M 3/157* (2013.01)

(58) Field of Classification Search

CPC ..... H02M 1/0012; H02M 3/157; H03M 1/124
See application file for complete search history.

(56) References Cited

U.S. PATENT DOCUMENTS

| | | | | |
|---|---|---|---|---|
| 7,239,257 | B1 * | 7/2007 | Alexander ............ | H02M 3/157 341/138 |
| 7,315,157 | B2 | 1/2008 | Chapuis | |
| 7,595,624 | B2 | 9/2009 | Tateishi et al. | |
| 7,595,686 | B2 | 9/2009 | Maksimovic et al. | |
| 8,860,329 | B2 * | 10/2014 | Wang .................... | H02M 3/157 323/283 |
| 9,203,305 | B2 * | 12/2015 | Trautmann ............. | G05B 11/42 |
| 9,292,028 | B2 | 3/2016 | Capodivacca et al. | |
| 2006/0055574 | A1 * | 3/2006 | Maksimovic ......... | G04F 10/005 341/155 |

(Continued)

*Primary Examiner* — Fred E Finch, III
(74) *Attorney, Agent, or Firm* — JCIPRNET

(57) ABSTRACT

A controller of a power converter is provided. The controller is coupled to a power output stage, provides a control signal thereto to generate an output voltage, and includes an analog-to-digital conversion circuit, a search circuit, a compensation circuit, and a pulse width modulation circuit. The analog-to-digital conversion circuit is coupled to the power output stage and is configured to output an error signal according to a feedback voltage related to the output voltage and a reference voltage. The search circuit is coupled to the analog-to-digital conversion circuit and searches according to the error signal to obtain search values. The compensation circuit is coupled to the search circuit and generates a duty cycle signal according to the search values. The pulse width modulation circuit is coupled to the compensation circuit and generates the control signal according to the duty cycle ratio signal to be provided to the power output stage.

7 Claims, 9 Drawing Sheets

(56) References Cited

U.S. PATENT DOCUMENTS

| | | | | |
|---|---|---|---|---|
| 2008/0042632 | A1* | 2/2008 | Chapuis | H02M 3/1588 323/283 |
| 2008/0252279 | A1* | 10/2008 | Wang | H02M 3/157 323/283 |
| 2008/0303501 | A1* | 12/2008 | Prodic | H02M 3/157 323/283 |
| 2012/0153917 | A1* | 6/2012 | Adell | H02M 3/1588 323/283 |
| 2018/0048318 | A1* | 2/2018 | Shankar | H02M 3/157 |

* cited by examiner

CONTROLLER OF POWER CONVERTER

CROSS-REFERENCE TO RELATED APPLICATION

This application claims the priority benefit of Taiwan application serial no. 112146451, filed on Nov. 30, 2023. The entirety of the above-mentioned patent application is hereby incorporated by reference herein and made a part of this specification.

BACKGROUND

Technical Field

The disclosure relates to a controller of a power converter, and in particular to a controller equipped with a search circuit.

Description of Related Art

When a conventional power converter performs signal processing, an analog-to-digital converter (ADC) and a compensator need to be used for signal processing. In particular, a high-resolution analog-to-digital converter and a complex compensator need to be used for a high-frequency operation. In this regard, since the conventional complex compensator must be equipped with a large number of multipliers, the circuit area of the power converter increases, and the high-resolution analog-to-digital converter increases power consumption. Therefore, how to reduce the circuit area of the power converter and lower power consumption is an important topic in the art.

SUMMARY

The disclosure relates to a controller of a power converter, which can effectively reduce the circuit area of the controller and lower the power consumption thereof.

The disclosure provides a controller of a power converter. The controller is coupled to a power output stage and provides a control signal to the power output stage to generate an output voltage. The controller includes an analog-to-digital conversion circuit, a search circuit, a compensation circuit, and a pulse width modulation circuit. The analog-to-digital conversion circuit receives a feedback voltage related to the output voltage and a reference voltage, and outputs an error signal. The search circuit is coupled to the analog-to-digital conversion circuit and searches according to the error signal to obtain multiple search values. The compensation circuit is coupled to the search circuit and generates a duty ratio signal according to the search values. The pulse width modulation circuit is coupled to the compensation circuit and generates a control signal according to the duty ratio signal to be provided to the power output stage.

In an embodiment of the disclosure, the search circuit includes multiple search tables respectively coupled to the analog-to-digital conversion circuit to receive the error signal to generate the search values.

In an embodiment of the disclosure, the analog-to-digital conversion circuit includes a signal generator, a computing unit, a comparator, and a control logic. The signal generator is configured to generate an incremental voltage during a quantization period. The computing unit is coupled to the signal generator and is configured to combine one of the feedback voltage and the reference voltage with the incremental voltage to generate an input signal. The comparator is coupled to the computing unit and is configured to generate a comparison result according to the input signal and the reference voltage during the quantization period. The control logic is coupled to the comparator and is configured to output the error signal according to the comparison result.

In an embodiment of the disclosure, the incremental voltage has different conversion functions within an error window and outside the error window during the quantization period.

In an embodiment of the disclosure, the signal generator is a step signal generator. A first resolution of the incremental voltage within an error window during the quantization period is higher than a second resolution of the incremental voltage outside the error window during the quantization period.

In an embodiment of the disclosure, the signal generator is a slope signal generator. A first slope of the incremental voltage within an error window during the quantization period is greater than a second slope of the incremental voltage outside the error window during the quantization period.

In an embodiment of the disclosure, the analog-to-digital conversion circuit further includes a sample and hold circuit. The sample and hold circuit is indirectly coupled between the power output stage and the computing unit to sample the feedback voltage during each quantization period to serve as a sampling voltage.

In an embodiment of the disclosure, the search values include a proportional error value and an integral error value. The compensation circuit generates a duty ratio signal according to the proportional error value and the integral error value.

In an embodiment of the disclosure, the proportional error value is generated through searching a first search table, and the integral error value is generated through searching a second search table. Search values of the first search table and the second search table are independent of each other.

Based on the above, the controller of the power converter of the disclosure may use the search circuit to provide the search value to adjust the duty ratio signal, thereby effectively controlling the power output stage. In this way, the circuit complexity of the controller can be effectively lowered to shrink the circuit area.

In order for the features and advantages of the disclosure to be more comprehensible, the following specific embodiments are described in detail in conjunction with the drawings.

DESCRIPTION OF THE EMBODIMENTS

Figure 1:
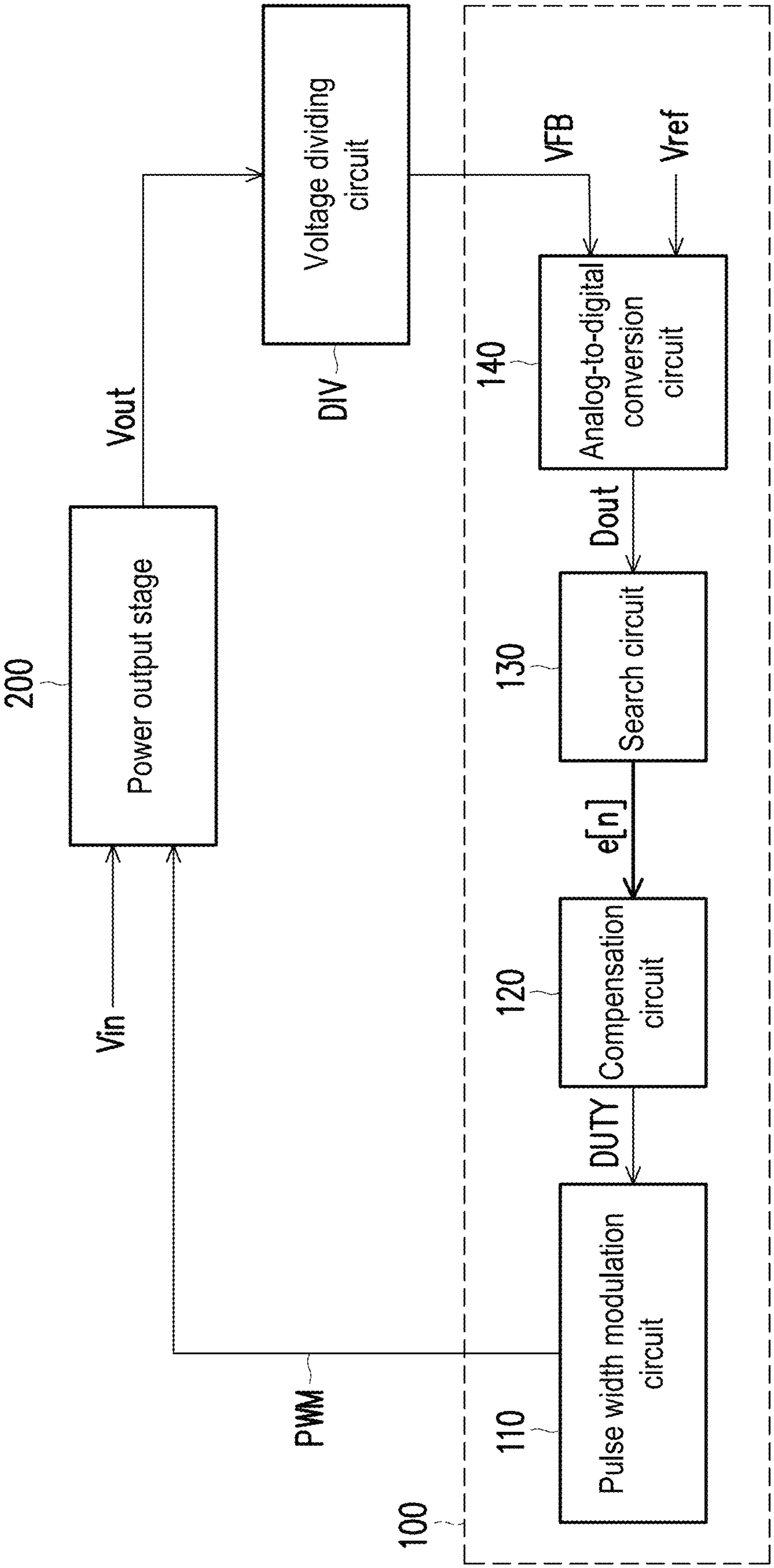
FIG. 1 is a schematic circuit diagram of a controller of a power converter according to an embodiment of the disclosure.

FIG. 1 is a schematic circuit diagram of a controller of a power converter according to an embodiment of the disclosure. Please refer to FIG. 1. A controller 100 includes a pulse width modulation circuit 110, a compensation circuit 120, a search circuit 130, and an analog-to-digital conversion circuit 140. The controller 100 is coupled to a power output stage 200 and a voltage dividing circuit DIV. The analog-to-digital conversion circuit 140 is coupled to the voltage dividing circuit DIV and the search circuit 130. The search circuit 130 is also coupled to the compensation circuit 120. The compensation circuit 120 is also coupled to the pulse width modulation circuit 110. The pulse width modulation circuit 110 is also coupled to the power output stage 200.

In the embodiment, the power output stage 200 may generate an output voltage Vout according to an input voltage Vin and a control signal PWM, and provide the output voltage Vout to the voltage dividing circuit DIV. The voltage dividing circuit DIV may further generate a feedback voltage VFB according to the output voltage Vout, and provide the feedback voltage VFB to the analog-to-digital conversion circuit 140. However, in an embodiment, the output voltage Vout may also be directly used as the feedback voltage VFB, so that the power output stage 200 may directly provide the output voltage Vout to the analog-to-digital conversion circuit 140.

In the embodiment, the analog-to-digital conversion circuit 140 may receive the feedback voltage VFB and a reference voltage Vref, and may generate an error signal Dout according to the feedback voltage VFB and the reference voltage Vref, wherein the error signal Dout is a digital signal. The analog-to-digital conversion circuit 140 may output the error signal Dout to the search circuit 130. In the embodiment, the search circuit 130 may receive the error signal Dout, and use a search table in the search circuit 130 to search according to the error signal Dout. The search circuit 130 may obtain a corresponding digital error amount e[n] by searching the search table.

In the embodiment, the compensation circuit 120 receives the digital error amount e[n] of the search circuit 130, and generates a duty ratio signal DUTY according to the digital error amount e[n]. The pulse width modulation circuit 110 receives the duty ratio signal DUTY of the compensation circuit 120, and generates the control signal PWM according to the duty ratio signal DUTY. The pulse width modulation circuit 110 may provide the control signal PWM to the power output stage 200. The power output stage 200 may adjust the magnitude of the output voltage Vout according to the control signal PWM and the input voltage Vin.

Figure 2:
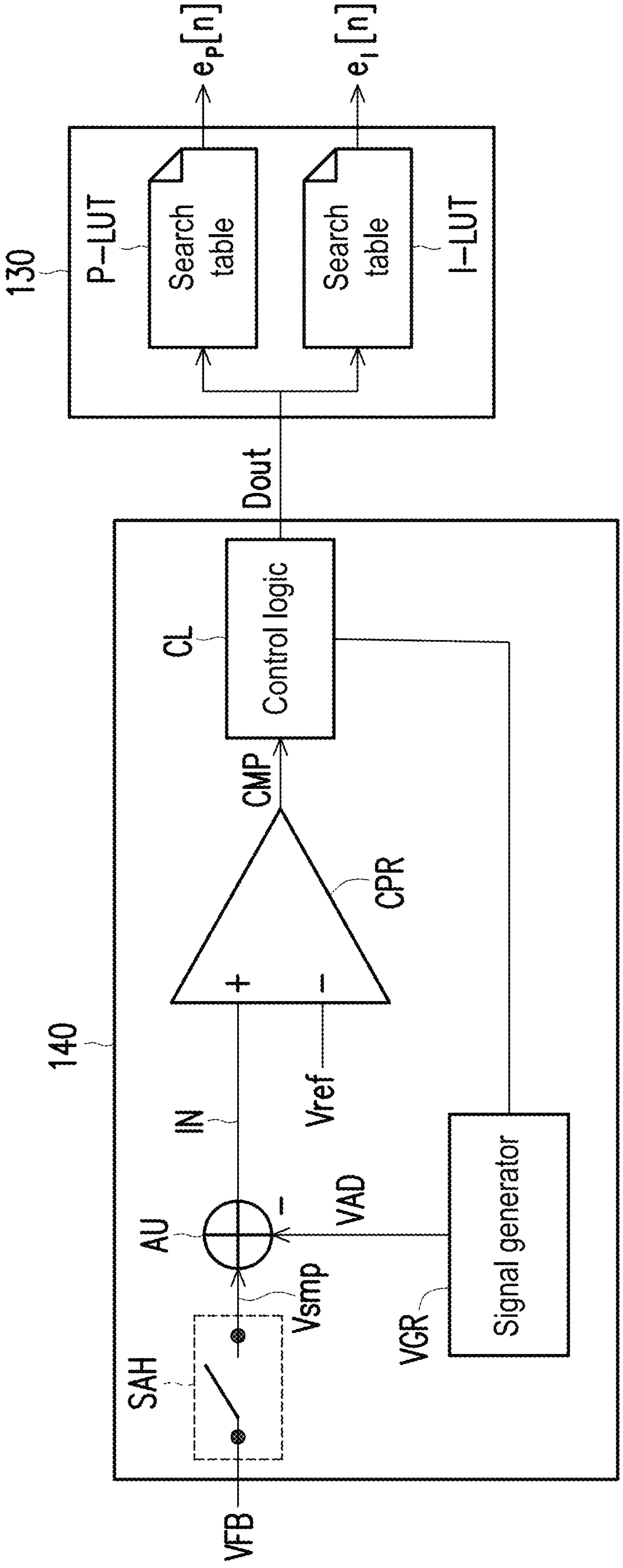
FIG. 2 is a schematic circuit diagram of an analog-to-digital conversion circuit and a search circuit according to an embodiment of the disclosure.

FIG. 2 is a schematic circuit diagram of an analog-to-digital conversion circuit and a search circuit according to an embodiment of the disclosure. Please refer to FIG. 2. The search circuit 130 and the analog-to-digital conversion circuit 140 of FIG. 1 may be implemented as the circuit architecture of FIG. 2. In the embodiment, the analog-to-digital conversion circuit 140 may include a sample and hold circuit SAH, a computing unit AU, a comparator CPR, a control logic CL, and a signal generator VGR. The search circuit 130 may include a search table P-LUT and a search table I-LUT. In the embodiment, the computing unit AU may be an adder. In the embodiment, the sample and hold circuit SAH is coupled between the power output stage 200 of FIG. 1 and the computing unit AU. The signal generator VGR is coupled to the control logic CL and the computing unit AU. A first input terminal (non-inverting input terminal) of the comparator CPR is coupled to the computing unit AU, and a second input terminal (inverting input terminal) of the comparator CPR is coupled to the reference voltage Vref. The control logic CL is coupled to an output terminal of the comparator CPR.

In the embodiment, the sample and hold circuit SAH may sample the feedback voltage VFB transmitted to the analog-to-digital conversion circuit 140 during each quantization period to generate a sampling voltage Vsmp. It is worth noting that the sample and hold circuit SAH may sample the voltage during each quantization period, and the sample and hold circuit SAH has the function of adjusting the sampling rate, so that the analog-to-digital conversion circuit 140 is more stable when performing signal conversion.

The signal generator VGR may generate an incremental voltage VAD during each quantization period. The computing unit AU may add the voltage value of the sampling voltage Vsmp and −1 times the voltage value of the incremental voltage VAD to generate an input signal IN. One of the input terminals (for example, a positive terminal) of the comparator CPR may receive the input signal IN, and the other input terminal (for example, a negative terminal) of the comparator CPR may receive the reference voltage Vref. The comparator CPR may compare the voltage magnitudes of the input signal IN and the reference voltage Vref to generate a comparison result CMP. The control logic CL may generate the error signal Dout according to the comparison result CMP.

In the embodiment, the search circuit 130 may receive the error signal Dout, and search the search table P-LUT and the search table I-LUT according to the error signal Dout. In the embodiment, the search table P-LUT may generate a digital error amount $e_P[n]$, wherein the digital error amount $e_P[n]$ may include n proportional error values. The search table I-LUT may generate a digital error amount $e_I[n]$, wherein the digital error amount $e_I[n]$ may include n integral error values.

In the embodiment, the controller 100 may find the proportional error value and the integral error value through the search table of the search circuit 130, so that the controller 100 does not need to use a conventional multiplier in the prior art to obtain the proportional error value and the integral error value. Therefore, the circuit element area required by the controller can be reduced.

Figure 3:
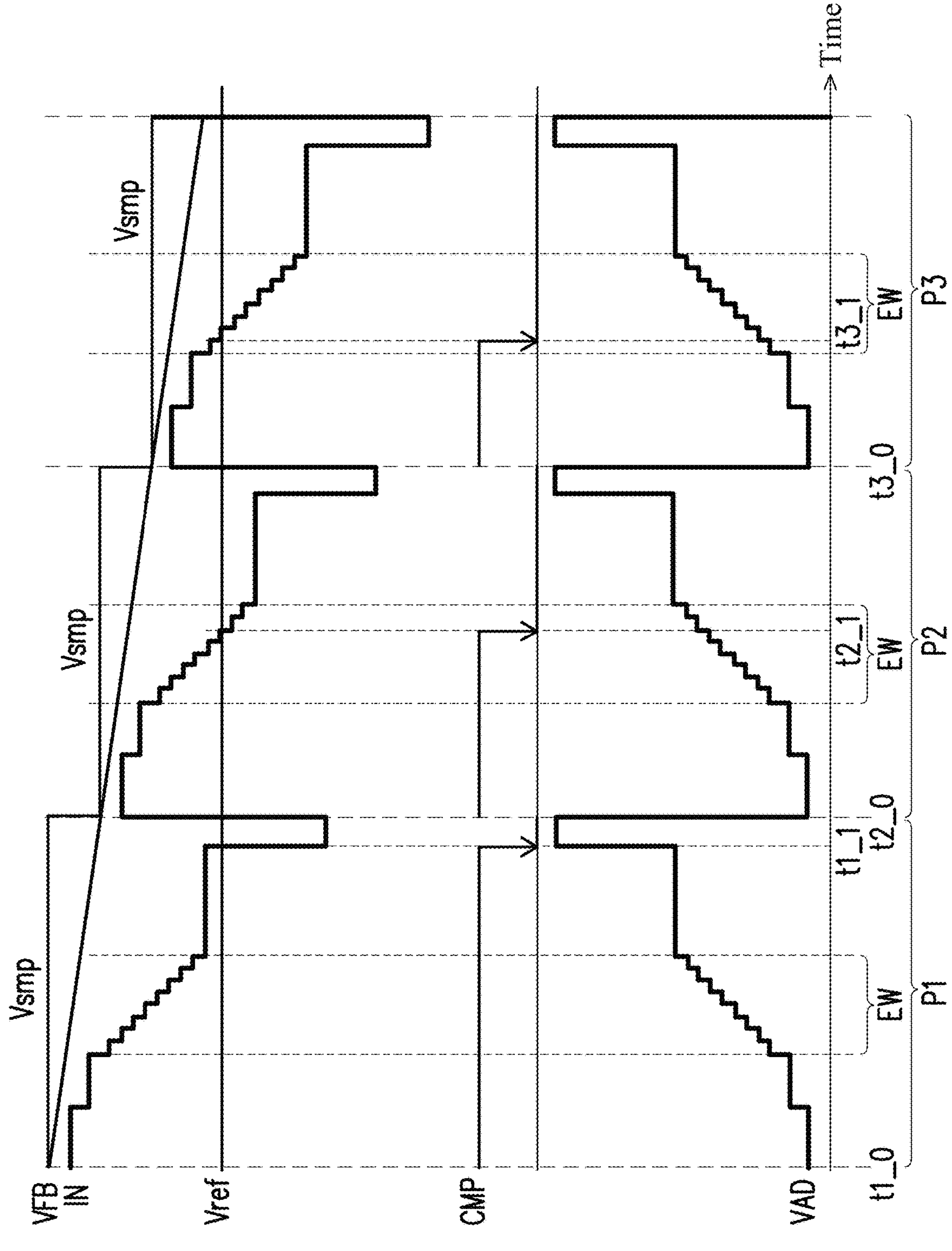
FIG. 3 is a timing diagram of multiple voltage signals according to an embodiment of FIG. 2 of the disclosure.
Figure 7:
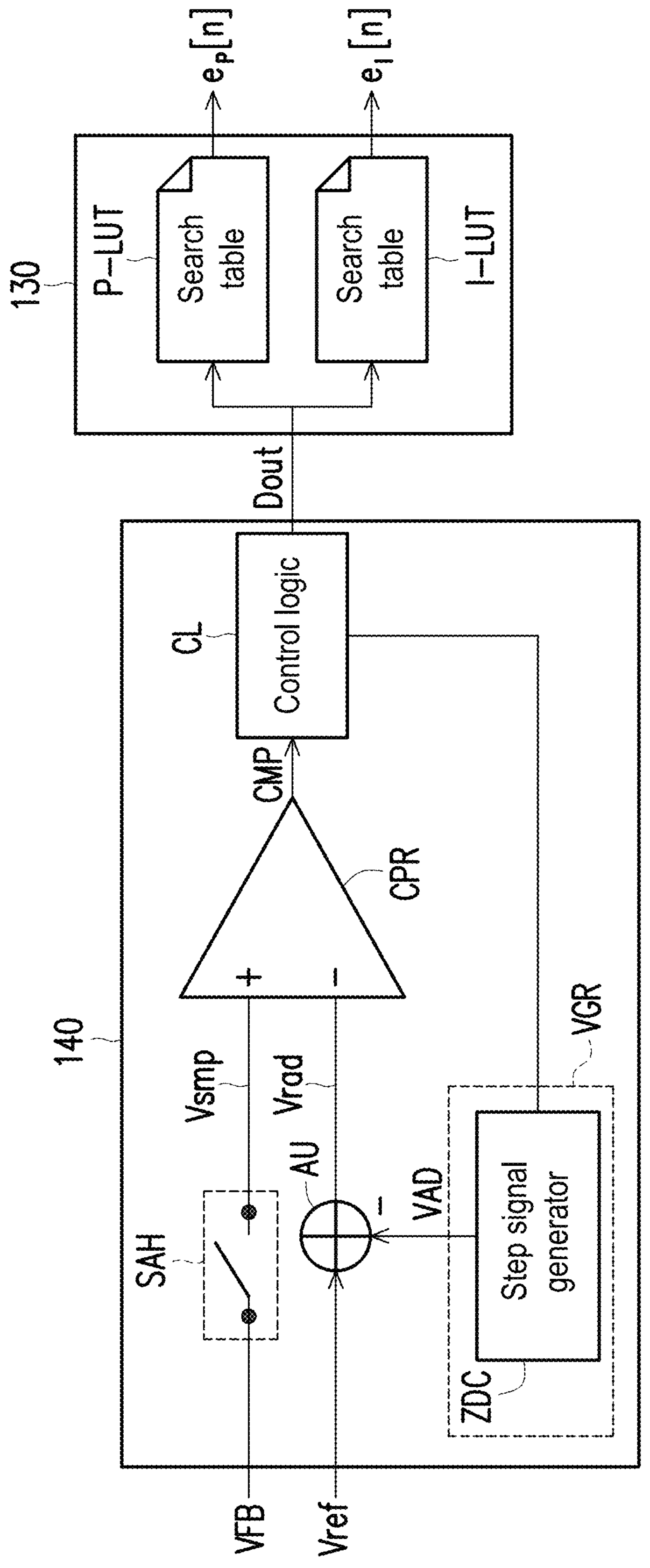
FIG. 7 is a schematic circuit diagram of a digital conversion circuit and a search circuit according to an embodiment of the disclosure.

FIG. 3 is a timing diagram of multiple voltage signals according to an embodiment of FIG. 2 of the disclosure. In the embodiment, the signal generator VGR of FIG. 2 may be a step signal generator ZDC (as shown in FIG. 7). The timing diagram of FIG. 3 reveals signal changes in three of the quantization periods (that is, a quantization period P1, a quantization period P2, and a quantization period P3). In the embodiment, during each quantization period, the voltage value of the feedback voltage VFB may linearly decrement as time increments. The incremental voltage VAD may have different conversion functions within an error window EW and outside the error window EW to generate different voltage increases. Within the error window EW, the increase in the incremental voltage VAD is greater. Outside the error window EW, the increase in the incremental voltage VAD is smaller. This means that the incremental voltage VAD has a greater resolution within the error window EW and a smaller resolution outside the error window EW.

In the embodiment, the voltage value of the input signal IN is equal to a difference obtained by subtracting the voltage value of the incremental voltage VAD from the voltage value of the sampling voltage Vsmp. The comparison result CMP is the comparison result between the input signal IN and the reference voltage Vref. In this regard, if the voltage value of the input signal IN is greater than the voltage value of the reference voltage Vref, the voltage value of the comparison result CMP is a high voltage level. On the contrary, if the voltage value of the input signal IN is less than the voltage value of the reference voltage Vref, the voltage value of the comparison result CMP is a low voltage level.

Specifically, during the quantization period P1, the sample and hold circuit SAH samples the feedback voltage VFB at a time point t1_0, so that the voltage value of the sampling voltage Vsmp is equal to the voltage value of the feedback voltage VFB at the time point t1_0 and is subtracted from the incremental voltage VAD to become the input signal IN. The voltage value of the input signal IN is smaller than the voltage value of the reference voltage Vref after a time point t1_1. Therefore, the voltage value of the comparison result CMP drops from the high voltage level to the low voltage level after the time point t1_1. Therefore, the control logic CL may output the corresponding error signal Dout according to the comparison result CMP dropping from the high voltage level to the low voltage level.

During the quantization period P2 and the quantization period P3, the control logic CL may also output the corresponding error signal Dout according to the comparison result CMP dropping from the high voltage level to the low voltage level. Reference may be made to the signal change description content of the quantization period P1 above for detailed content.

Figure 4:
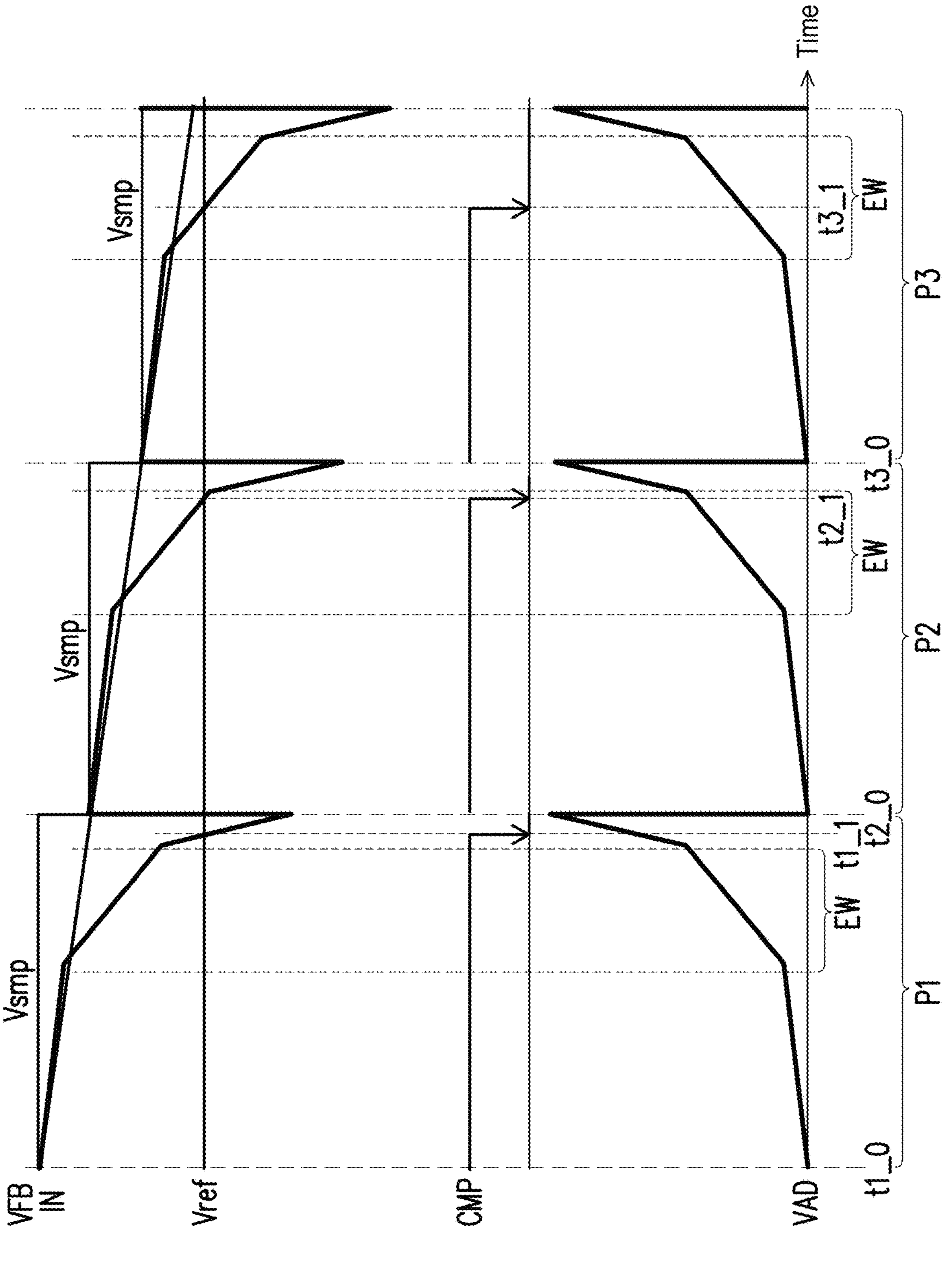
FIG. 4 is a timing diagram of multiple voltage signals according to another embodiment of FIG. 2 of the disclosure.

FIG. 4 is a timing diagram of multiple voltage signals according to another embodiment of FIG. 2 of the disclosure. In the embodiment, the signal generator VGR of FIG. 2 may be a ramp signal generator. The timing diagram of FIG. 5 reveals signal changes in three of the quantization periods (that is, the quantization period P1, the quantization period P2, and the quantization period P3). In the embodiment, during each quantization period, the voltage value of the feedback voltage VFB may linearly decrement as time increments, and the voltage value of the incremental voltage VAD may linearly increment as time increments. It is worth noting that the voltage value of the incremental voltage VAD may have three different slope changes at time points before the error window EW, within the error window EW, and after the error window EW.

When the time point is before the error window EW, the voltage value of the incremental voltage VAD has a first slope. When the time point is within the error window EW, the voltage value of the incremental voltage VAD has a second slope. When the time point is after the error window EW, the voltage value of the incremental voltage VAD has a third slope. The third slope is greater than the second slope, and the second slope is greater than the first slope.

Specifically, during the quantization period P1, the sample and hold circuit SAH samples the feedback voltage VFB at the time point t1_0, so that the voltage value of the sampling voltage Vsmp is equal to the voltage value of the feedback voltage VFB at the time point t1_0. The voltage value of the input signal IN is smaller than the voltage value of the reference voltage Vref after the time point t1_1. Therefore, the voltage value of the comparison result CMP drops from the high voltage level to the low voltage level after the time point t1_1. Therefore, the control logic CL may output the corresponding error signal Dout according to the comparison result CMP dropping from the high voltage level to the low voltage level.

During the quantization period P2 and the quantization period P3, the control logic CL may also output the corresponding error signal Dout according to the comparison result CMP dropping from the high voltage level to the low voltage level. Reference may be made to the signal change description content of the quantization period P1 above for detailed content.

Figure 5:
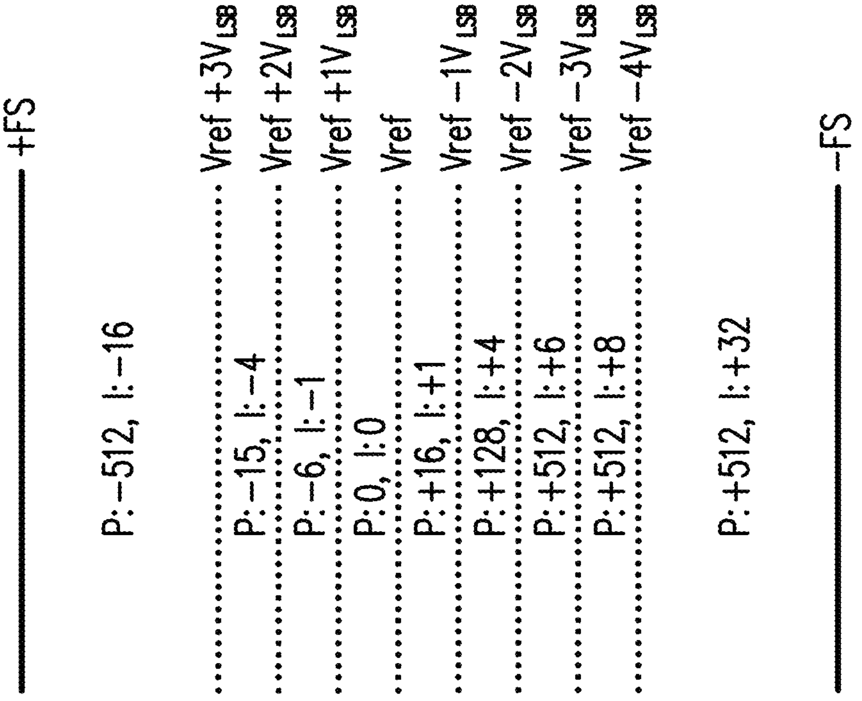
FIG. 5 is a schematic diagram of a search value correspondence relationship according to an embodiment of the disclosure.

FIG. 5 is a schematic diagram of a search value correspondence relationship according to an embodiment of the disclosure. Please refer to FIG. 5. FIG. 5 is used to illustrate an exemplary embodiment of the search value correspondence relationship, and the disclosure is not limited thereto. In the embodiment, the maximum voltage value of the input signal IN may be a voltage value +FS, and the minimum voltage value of the input signal IN may be a voltage value −FS. An error voltage value VLSB is the voltage value of the error signal Dout. In this regard, the search circuit 130 may obtain a corresponding search value according to a difference value between the input signal IN and the reference voltage Vref.

For example, when the voltage value of the input signal IN is between the voltage value +FS and the voltage value of the reference voltage Vref plus 3 times the error voltage value VLSB, a proportional error value P that the search circuit 130 may retrieve from the search table P-LUT is −512, and an integral error value I that the search circuit 130 may retrieve from the search table I-LUT is −16. When the voltage value of the input signal IN is between the voltage value of the voltage reference voltage Vref plus 3 times the error voltage value VLSB and the voltage value of the reference voltage Vref plus 2 times the error voltage value VLSB, the proportional error value P that the search circuit 130 may retrieve from the search table P-LUT is −15, and the integral error value I that the search circuit 130 may retrieve from the search table I-LUT is −4. It is worth noting that each search value in the search table P-LUT and each search value in the search table I-LUT are independent of each other. In other words, the digital error amount $e_P[n]$ of the search table P-LUT and the digital error amount $e_I[n]$ of the search table I-LUT have no dependence.

Figure 6:
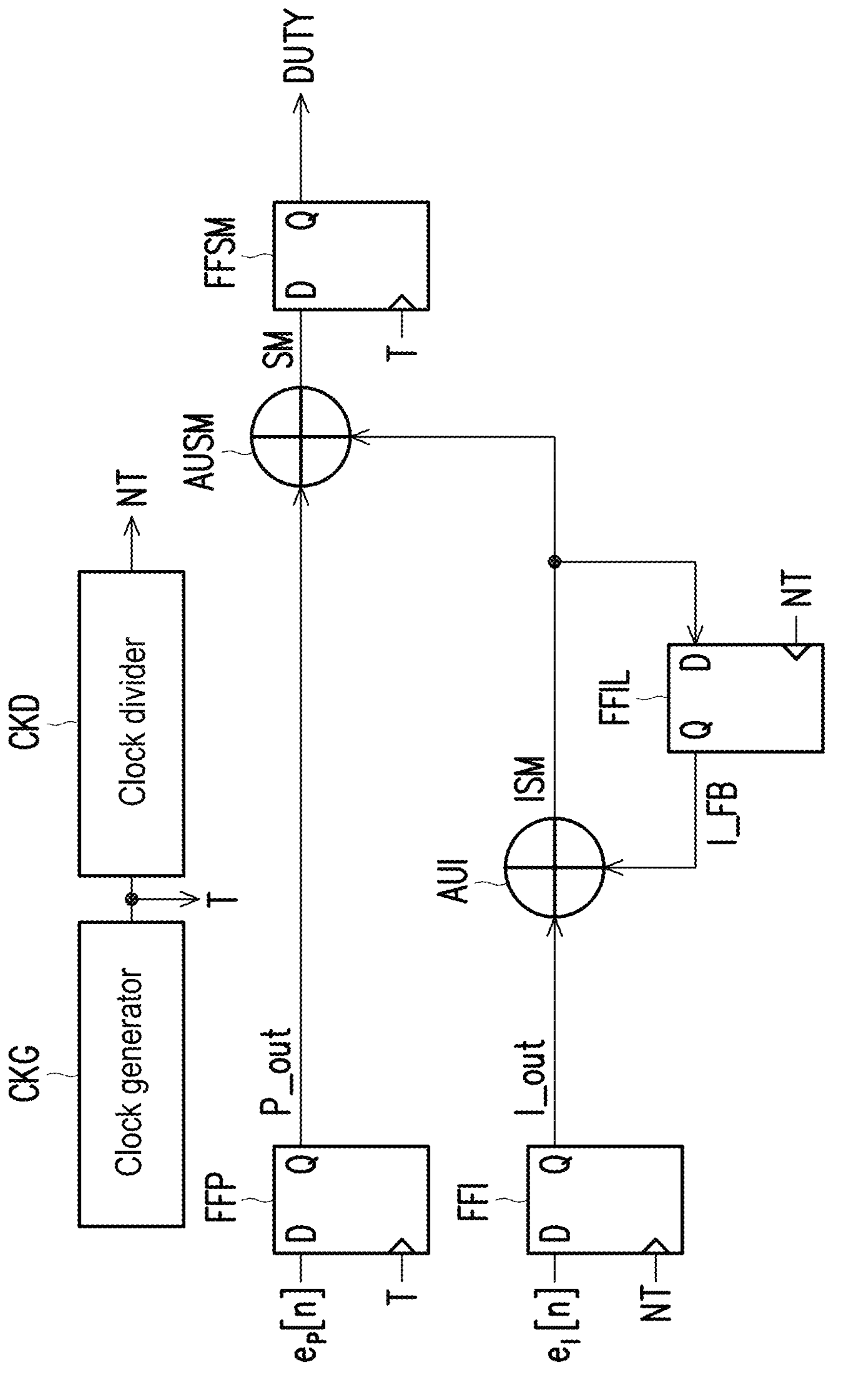
FIG. 6 is a schematic circuit diagram of a compensation circuit according to an embodiment of the disclosure.

FIG. 6 is a schematic circuit diagram of a compensation circuit according to an embodiment of the disclosure. Please refer to FIG. 6. The compensation circuit 120 of FIG. 1 may be implemented as the circuit architecture of FIG. 6. The compensation circuit 120 may include a clock generator CKG, a clock divider CKD, a flip flop FFP, a flip flop FFI, a flip flop FFSM, a flip flop FFIL, a computing unit AUSM, and a computing unit AUI. The flip flop FFP is coupled to the computing unit AUSM. The flip flop FFI is coupled to an input terminal of the computing unit AUI. The other input terminal of the computing unit AUI is coupled to an output terminal of the flip flop FFIL, and an output terminal of the computing unit AUI is coupled to an input terminal of the flip flop FFIL. One of the input terminals of the computing unit AUSM is coupled to the flip flop FFP, the other input terminal of the computing unit AUSM is coupled to the computing unit AUI, and an output terminal of the computing unit AUSM is coupled to the flip flop FFSM. In the embodiment, the computing unit AUSM and the computing unit AUI may be adders.

In the embodiment, the clock generator CKG may generate a clock T, and transmit the clock T to the clock divider CKD. The clock divider CKD may divide the clock T to generate a divided clock NT, wherein the period of the divided clock NT is a positive integer multiple of the clock T. In the embodiment, a data input terminal of the flip flop FFP receives the digital error amount $e_P[n]$, and a clock input terminal of the flip flop FFP receives the clock T, and outputs a computed value P_out from an output terminal according to the clock T. A data input terminal of the flip flop FFI receives the digital error amount $e_I[n]$, and a clock input terminal of the flip flop FFI receives the divided clock NT, and outputs a computed value I_out from an output terminal according to the divided clock NT.

In the embodiment, the computing unit AUI may add the computed value I_out and a computed value I_FB to generate a computed result ISM. A data input terminal of the flip flop FFIL receives the computed result ISM, and a clock input terminal of the flip flop FFIL receives the divided clock NT, and outputs the computed value I_FB from the output terminal according to the computed result ISM and the divided clock NT. In other words, the flip flop FFIL may feed back the computed result ISM, and generate the computed value I_FB according to the divided clock NT. In the embodiment, the computing unit AUSM may add the computed value P_out and the computed result ISM to output a computed result SM to the flip flop FFSM. Therefore, the flip flop FFSM may receive the computed result SM, and generate the duty ratio signal DUTY according to the clock T.

FIG. 7 is a schematic circuit diagram of a digital conversion circuit and a search circuit according to an embodiment of the disclosure. Please refer to FIG. 7. The search circuit 130 and the analog-to-digital conversion circuit 140 of FIG. 1 may be implemented as the circuit architecture of FIG. 7. In the embodiment, the analog-to-digital conversion circuit 140 may include the sample and hold circuit SAH, the computing unit AU, the comparator CPR, the control logic CL, and the signal generator VGR. The search circuit 130 may include the search table P-LUT and the search table I-LUT.

In the embodiment, the sample and hold circuit SAH is coupled between the power output stage 200 and the computing unit AU to sample the feedback voltage VFB transmitted to the analog-to-digital conversion circuit 140 during each quantization period to generate the sampling voltage Vsmp. The signal generator VGR is coupled to the control logic CL, and the signal generator VGR may generate the incremental voltage VAD during each quantization period. The computing unit AU may add the voltage value of the reference voltage Vref and −1 times the voltage value of the incremental voltage VAD to generate a reference step voltage Vrad. The comparator CPR may receive the sampling signal Vsmp at the first input terminal (for example, the positive terminal), and receive the reference step voltage Vrad at the second input terminal (for example, the negative terminal), and compare the voltage magnitudes of the sampling signal Vsmp and the reference step voltage Vrad to generate the comparison result CMP. The control logic CL is coupled to the comparator CPR and generates the error signal Dout according to the comparison result CMP.

In the embodiment, the search circuit 130 may receive the error signal Dout, and search the search table P-LUT and the search table I-LUT according to the error signal Dout. In the embodiment, the search table P-LUT may generate the digital error amount $e_P[n]$, wherein the digital error amount $e_P[n]$ may include n proportional error values. The search table I-LUT may generate the digital error amount $e_I[n]$, wherein the digital error amount $e_I[n]$ may include n integral error values.

Figure 8:
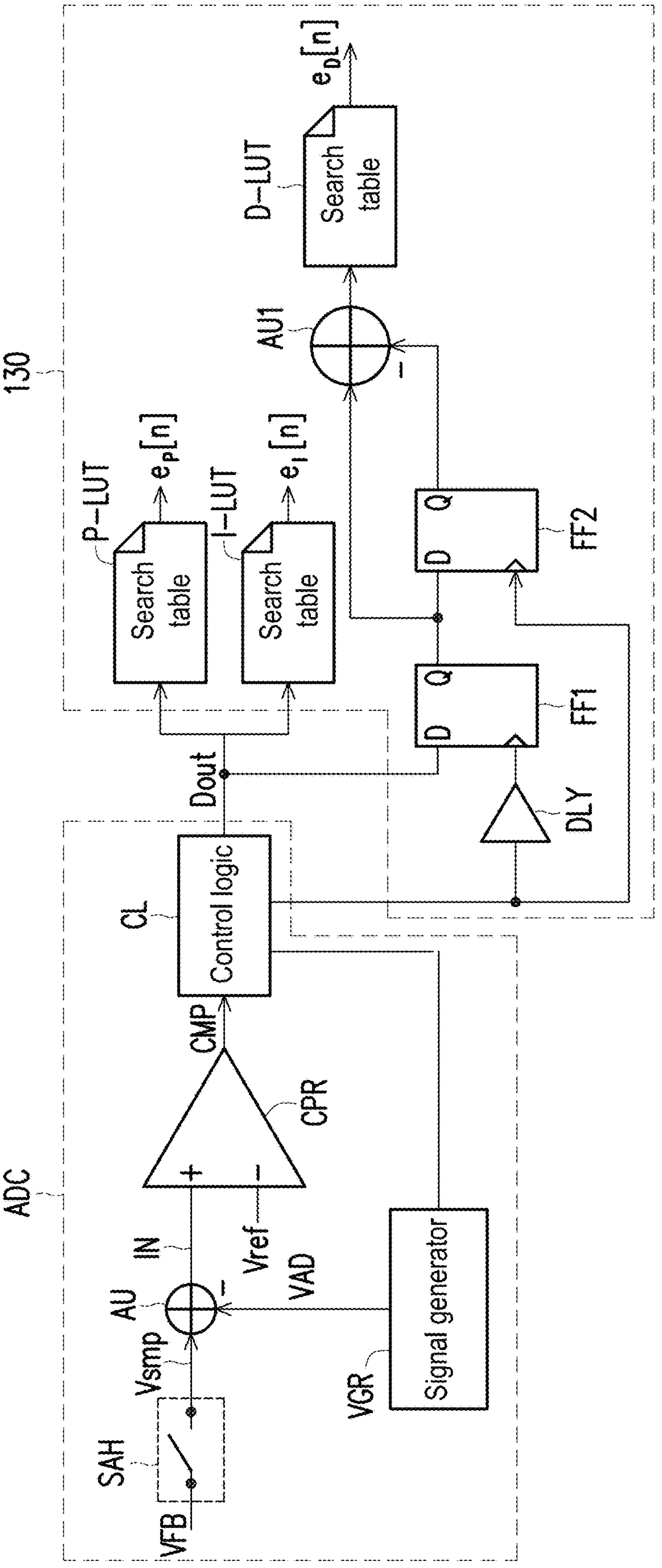
FIG. 8 is a schematic circuit diagram of a digital conversion circuit and a search circuit according to an embodiment of the disclosure.

FIG. 8 is a schematic circuit diagram of a digital conversion circuit and a search circuit according to an embodiment of the disclosure. Please refer to FIG. 8. The search circuit 130 and the analog-to-digital conversion circuit 140 of FIG. 1 may be implemented as the circuit architecture of FIG. 8. In the embodiment, the analog-to-digital conversion circuit 140 may include the sample and hold circuit SAH, the computing unit AU, the comparator CPR, the control logic CL, and the signal generator VGR. The difference between FIG. 8 and FIG. 2 is that the control logic CL of FIG. 8 may generate a clock CLT, and the search circuit 130 of FIG. 8 includes a search table D-LUT, a delay circuit DLY, a flip flop FF1, a flip flop FF2, a computing unit AU1. The flip flop FF1 and the flip flop FF2 are D-type flip flops, and the computing unit AU1 is an adder.

In the embodiment, the search table P-LUT and the search table I-LUT are both coupled to an output terminal of the control logic CL. The delay circuit DLY is coupled to the control logic CL. The flip flop FF1 is coupled to the control logic CL and the delay circuit DLY. The flip flop FF2 is coupled to the control logic CL and the flip flop FF1. The computing unit AU1 is coupled to the flip flop FF1 and the flip flop FF2. The search table D-LUT is coupled to the computing unit AU1.

In the embodiment, the search circuit 130 may receive the error signal Dout, and search the search table P-LUT and the search table I-LUT according to the error signal Dout. The search table P-LUT may generate the digital error amount $e_P[n]$, wherein the digital error amount $e_P[n]$ may include n proportional error values. The search table I-LUT may generate the digital error amount $e_I[n]$, wherein the digital error amount $e_I[n]$ may include n integral error values.

In the embodiment, a data input terminal of the flip flop FF1 may receive the error signal Dout. A clock input terminal of the flip flop FF1 may receive an output signal of the delay circuit DLY, and the output signal of the delay circuit DLY is the delayed clock CLT. A data input terminal of the flip flop FF2 may receive an output signal of the flip flop FF1, and a clock input terminal of the flip flop FF2 may receive the clock CLT. In the embodiment, the computing unit AU1 may subtract the output signal of the flip flop FF2 from the output signal of the flip flop FF1, so as to calculate the number of quantization levels between two adjacent quantization periods. Furthermore, the search table D-LUT may receive the number of quantization levels to generate a digital error amount $e_P[n]$, wherein the digital error amount $e_P[n]$ may include n differential error values.

Figure 9:
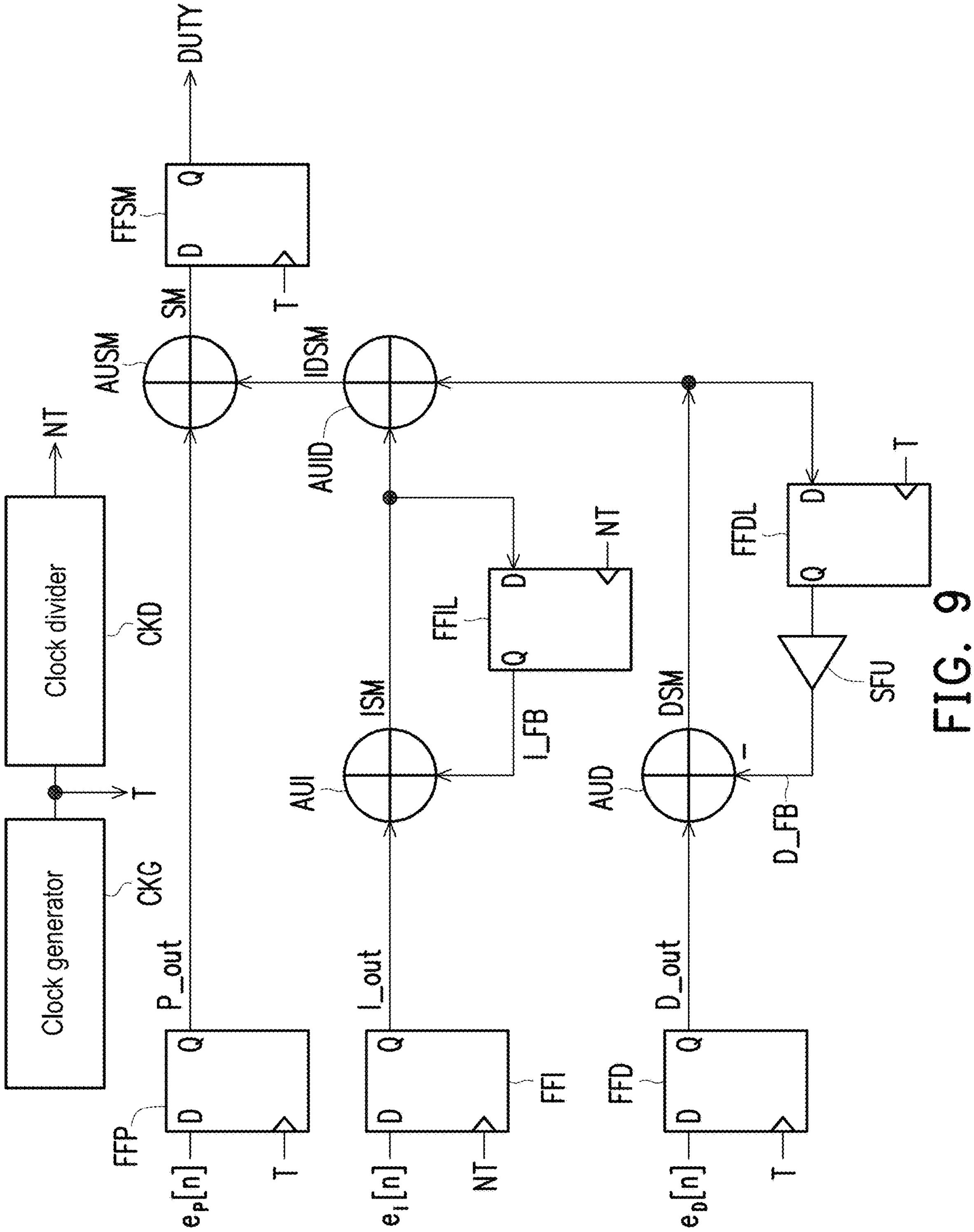
FIG. 9 is a schematic circuit diagram of a compensation circuit according to an embodiment of the disclosure.

FIG. 9 is a schematic circuit diagram of a compensation circuit according to an embodiment of the disclosure. Please refer to FIG. 9. The compensation circuit 120 of FIG. 1 may be implemented as the circuit architecture of FIG. 9. The compensation circuit 120 may include the clock generator CKG, the clock divider CKD, the flip flop FFP, the flip flop FFI, the flip flop FFSM, the flip flop FFIL, a flip flop FFD, a flip flop FFDL, the computing unit AUSM, the computing unit AUI, a computing unit AUD, a computing unit AUDI, and a shift unit SFU.

In the embodiment, the flip flop FFP, the flip flop FFI, the flip flop FFSM, the flip flop FFIL, the flip flop FFD, and the flip flop FFD may be D-type flip flops, but the disclosure is not limited thereto. In the embodiment, the computing unit AUSM, the computing unit AUI, the computing unit AUD, and the computing unit AUDI may be adders, but the disclosure is not limited thereto.

In the embodiment, the clock generator CKG is coupled to the clock divider CKD. The input terminal of the computing unit AUI is coupled to the flip flop FFI, and the other input terminal of the computing unit AUI is coupled to the output terminal of the flip flop FFIL. The input terminal of the flip flop FFIL is coupled to the output terminal of the computing unit AUI. An input terminal of the computing unit AUD is coupled to the flip flop FFD, and the other input terminal of the computing unit AUD is coupled to an output terminal of the shift unit SFU. The input terminal of the flip flop FFIL is coupled to the output terminal of the computing unit AUI, and the output terminal of the flip flop FFIL is coupled to an input terminal of the computing unit AUI. The computing unit AUID is coupled to the computing unit AUI and the computing unit AUD. The computing unit AUSM is coupled to the computing unit AUID and the flip flop FFP. The flip flop FFSM is coupled to the computing unit AUSM.

In the embodiment, the clock generator CKG may generate the clock T, and transmit the clock T to the clock divider CKD. The clock divider CKD may divide the clock T to generate the divided clock NT, wherein the period of the divided clock NT is a positive integer multiple of the clock T. In the embodiment, the data input terminal of the flip flop FFP receives the digital error amount $e_P[n]$, and the clock input terminal of the flip flop FFP receives the clock T, and generates the computed value P_out according to the clock T. The data input terminal of the flip flop FFI receives the digital error amount $e_I[n]$, and the clock input terminal of the flip flop FFI receives the divided clock NT, and generates the computed value I_out according to the divided clock NT. In the embodiment, the computing unit AUI may add the computed value I_out and the computed value I_FB to generate the computed result ISM. The flip flop FFIL may feed back the computed result ISM, and generate the computed value I_FB according to the divided clock NT.

In the embodiment, a data input terminal of the flip flop FFD receives the digital error amount $e_P[n]$, and a clock input terminal of the flip flop FFD receives the clock T, and generates a computed value D_out according to the clock T. In the embodiment, the computing unit AUD may subtract the computed value D_out and a computed value D_FB to generate a computed result DSM. In the embodiment, the computed value D_FB is an output value of the shift unit SFU. The shift unit SFU may perform a right shift operation on an input value of the shift unit SFU. The flip flop FFDL feeds back the computed result DSM, and generates the input value of the shift unit SFU according to the clock T.

In the embodiment, the computing unit AUID may add the computed result ISM and the computed result DSM to generate a computed result IDSM. The computing unit AUSM may add the computed value P_out and the computed result IDSM to generate the computed result SM. Therefore, the flip flop FFSM may receive the computed result SM, and generate the duty ratio signal DUTY according to the clock T.

In summary, the controller of the power converter of the disclosure uses the digital error amount obtained by the search circuit to enable the compensation circuit to adjust the duty ratio signal, so as to control the power output stage, thereby lowering the complexity and shrinking the area of the controller.

Finally, it should be noted that the above embodiments are only used to illustrate, but not to limit, the technical solutions of the disclosure. Although the disclosure has been described in detail with reference to the above embodiments, persons skilled in the art should understand that the technical solutions described in the above embodiments may still be modified or some or all of the technical features thereof may be equivalently replaced. However, the modifications or replacements do not cause the essence of the corresponding technical solutions to deviate from the scope of the technical solutions of the embodiments of the disclosure.

What is claimed is:

1. A controller of a power converter, wherein the controller is coupled to a power output stage and provides a control signal to the power output stage to generate an output voltage, and the controller comprises:

an analog-to-digital conversion circuit, receiving a feedback voltage related to the output voltage and a reference voltage, and outputting an error signal;

a search circuit, coupled to the analog-to-digital conversion circuit and searching according to the error signal to obtain a plurality of search values, a compensation circuit, coupled to the search circuit and generating a duty ratio signal according to the search values; and a pulse width modulation circuit, coupled to the compensation circuit and generating the control signal according to the duty ratio signal to be provided to the power output stage, wherein the analog-to-digital conversion circuit comprises:

a signal generator, configured to generate an incremental voltage during a quantization period, wherein the signal generator is a step signal generator, and a first resolution of the incremental voltage within an error window during the quantization period is higher than a second resolution of the incremental voltage outside the error window during the quantization period;

a computing unit, coupled to the signal generator and configured to combine the feedback voltage or the reference voltage with the incremental voltage to generate an input signal;

a comparator, coupled to the computing unit and configured to generate a comparison result according to the input signal and the reference voltage during the quantization period; and a control logic, coupled to the comparator and configured to output the error signal according to the comparison result.

2. The controller according to claim 1, wherein the search circuit stores a plurality of search tables to receive the error signal to generate the search values.

3. The controller according to claim 1, wherein the incremental voltage has different conversion functions within an error window and outside the error window during the quantization period.

4. The controller according to claim 1, wherein the analog-to-digital conversion circuit further comprises:

a sample and hold circuit, indirectly coupled between the power output stage and the computing unit to sample the feedback voltage during each quantization period to serve as a sampling voltage.

5. The controller according to claim 1, wherein the search values comprise a proportional error value and an integral error value, and the compensation circuit generates the duty ratio signal according to the proportional error value and the integral error value.

6. The controller according to claim 5, wherein the proportional error value is generated through searching a first search table, and the integral error value is generated through searching a second search table, wherein search values of the first search table and the second search table are independent of each other.

7. A controller of a power converter, wherein the controller is coupled to a power output stage and provides a control signal to the power output stage to generate an output voltage, and the controller comprises:

an analog-to-digital conversion circuit, receiving a feedback voltage related to the output voltage and a reference voltage, and outputting an error signal;

a search circuit, coupled to the analog-to-digital conversion circuit and searching according to the error signal to obtain a plurality of search values, a compensation circuit, coupled to the search circuit and generating a duty ratio signal according to the search values; and a pulse width modulation circuit, coupled to the compensation circuit and generating the control signal according to the duty ratio signal to be provided to the power output stage, wherein the analog-to-digital conversion circuit comprises:

a signal generator, configured to generate an incremental voltage during a quantization period, wherein the signal generator is a ramp signal generator, and a first slope of the incremental voltage within an error window during the quantization period is greater than a second slope of the incremental voltage outside the error window during the quantization period;

a computing unit, coupled to the signal generator and configured to combine the feedback voltage or the reference voltage with the incremental voltage to generate an input signal;

a comparator, coupled to the computing unit and configured to generate a comparison result according to the input signal and the reference voltage during the quantization period; and a control logic, coupled to the comparator and configured to output the error signal according to the comparison result.

* * * * *